(12) United States Patent
Ebel, Sr.

(10) Patent No.: US 6,879,648 B2
(45) Date of Patent: Apr. 12, 2005

(54) TURBO DECODER STOPPING BASED ON MEAN AND VARIANCE OF EXTRINSICS

(75) Inventor: William J. Ebel, Sr., Manchester, MO (US)

(73) Assignee: Texas Instruments Incorporated, Dallas, TX (US)

( * ) Notice: Subject to any disclaimer, the term of this patent is extended or adjusted under 35 U.S.C. 154(b) by 738 days.

(21) Appl. No.: 09/772,676

(22) Filed: Jan. 30, 2001

(65) Prior Publication Data

US 2001/0028690 A1 Oct. 11, 2001

Related U.S. Application Data

(60) Provisional application No. 60/179,253, filed on Jan. 31, 2000.

(51) Int. Cl.[7] ............................. H03D 1/00; H04L 27/06
(52) U.S. Cl. ........................ 375/340; 714/752; 714/786
(58) Field of Search ................................. 375/340, 147; 714/774; 371/43.1

(56) References Cited

U.S. PATENT DOCUMENTS

| | | | | |
|---|---|---|---|---|
| 5,761,248 A | * | 6/1998 | Hagenauer et al. | 375/340 |
| 6,145,114 A | * | 11/2000 | Crozier et al. | 714/794 |
| 6,161,209 A | * | 12/2000 | Moher | 714/780 |
| 6,233,709 B1 | * | 5/2001 | Zhang et al. | 714/774 |
| 6,393,257 B1 | * | 5/2002 | Holtzman | 455/67.13 |
| 6,510,536 B1 | * | 1/2003 | Crozier et al. | 714/755 |
| 6,529,631 B1 | * | 3/2003 | Peterson et al. | 382/232 |
| 6,542,558 B1 | * | 4/2003 | Schulist et al. | 375/340 |
| 6,671,335 B1 | * | 12/2003 | Kim et al. | 375/340 |

OTHER PUBLICATIONS

Iterative decoding of binary block and convolutional codes Hagenauer, J.; Offer, E.; Papke, L.; Information Theory, IEEE Transactions on , vol.: 42 , Issue: 2 , Mar. 1996 pp.: 429–445.*

Two simple stopping criteria for turbo decoding Shao, R.Y.; Shu Lin; Fossorier, M.P.C.; Communications, IEEE Transactions on , vol.: 47 , Issue: 8 , Aug. 1999 pp.: 1117–1120.*

"Turbo decoder" Wangrok Oh; Kyungwhoon Cheun; Communications Letters, IEEE , vol.: 4 , Issue: 8 , Aug. 2000 pp.:255–257.*

K. Gracie, S. Crozier, and A. Hunt, "Performance of a Low–Complexity Turbo Decoder with a Simple Early Stopping Criterion Implemented on a SHARC Processor", IMSC 99, Proceedings of the Sixth International Mobile Satellite Conference, Ottawa, Ontario, Ca.*

Illuminating the Structure of Code and Decoder of Parallel Concatenated Recursive Systematic (TURBO) codes; Patrick Robertson, Institute for Communications Technology 1994.*

Concatenated Convolutional Codes with Interleavers; Sergio Benedetto, Guido Montorsi, CERCOM Aug. 2003 IEEE Communications Magazine.*

* cited by examiner

Primary Examiner—Stephen Chin
Assistant Examiner—Harry Vartanian
(74) Attorney, Agent, or Firm—Ronald O. Neerings; Wade James Brady, III; Frederick J. Telecky, Jr.

(57) ABSTRACT

An adaptive stopping criterion improvement for an iterative decoder, in which iteration is halted by observing a signal-to-noise ratio generated from the mean and variance of the soft estimates (or their divergence).

10 Claims, 3 Drawing Sheets

TURBO DECODER STOPPING BASED ON MEAN AND VARIANCE OF EXTRINSICS

This application claims priority under 35 U.S.C. §119(e)(1) of provisional application Ser. No. 60/179,253, filed Jan. 31, 2000, the entirety of which is incorporated herein by reference.

BACKGROUND AND SUMMARY OF THE INVENTION

The present application relates to error control systems in data transmission, especially to iterative decoding using parallel concatenated encoders, such as turbo decoders.

Background: Signals and Noisy Channels

No communications channel is perfect. In the real world, every communications channel includes some "noise" (unpredictable non-signal inputs). The amount of noise is usually quantified by the signal-to-noise ratio, or "SNR", which is stated in decibels. (For example, if the signal power is one hundred times the noise power, the SNR would be about 20 dB.) Higher SNRs are more desirable, but the SNR (at a given transmission rate) is set by the physics of the channel, as well as by the design of the transmitter and receiver. Even though digital signals are generally less susceptible to degradation than analog signals, many channels include enough noise to induce some errors in a digital signal. In many applications a desired data rate can easily be achieved at reasonable cost, but the worst-case level of bit errors with such a configuration is excessive. In such cases coding techniques can be used to reduce the error rate (at the cost of a slightly reduced gross data rate).

Similar techniques can also be used with data storage architectures. In this case, the "channel" is the storage medium and the interfaces to it. For example, in a hard disk drive the write head is an analog driver stage which may not be perfectly aligned to the desired radial position on the disk. Data can be degraded, during writing, storage, or reading, by factors such as mistracking, overtemperature, particulate contamination, or mechanical failure.

Background: Error-Control Coding

Coded digital communication systems use error control codes to improve data reliability at a given signal-to-noise ratio (SNR). For example, an extremely simple form (used in data storage applications) is to generate and transmit a parity bit with every eight bits of data; by checking parity on each block of nine bits, single-bit errors can be detected. (By adding three error-correction bits to each block, single-bit errors can be detected and corrected.) In general, error control coding includes a large variety of techniques for generating extra bits to accompany a data stream, allowing errors in the data stream to be detected and possibly corrected.

A famous existence proof (Shannon's noisy channel coding theorem) states that error rates can be made as low as desired by using optimal error control codes. This theorem did not itself tell how to derive the optimal error control coding, and for decades no coding schemes were able to come close to the theoretical limits defined by this theorem. However, a major breakthrough was achieved in 1993, when turbo codes were introduced.

Background: "Turbo" Coding

The encoder side of a turbo coding architecture typically uses two encoders, one operating on the raw data stream and one on a shuffled copy of the base data stream, to generate two parity bits for each bit of the raw data stream. The encoder output thus contains three times as many bits as the incoming data stream. This "parallel concatenated encoder" (or "PCE") configuration is described in detail below.

The most surprising part of turbo coding was its decoding architecture. The decoder side invokes a process which (if the channel were noiseless) would merely reverse the transformation performed on the encoder side, to reproduce the original data. However, the decoder side is configured to operate on soft estimates of the information bits and refines the estimates through an iterative reestimation process. The decoder does not have to reach a decision on its first pass, but is generally allowed to iteratively improve the estimates of the information bits until convergence is achieved. (A more detailed description of this is provided below.)

One drawback to the turbo decoder is that some received codewords require many iterations to converge. The ability to improve estimates by iteration is a great strength, since it means that the decoding performance can be nearly optimal; but every iteration requires additional time, computing resources, and/or battery energy. Thus in practice it is desirable to find a way to stop turbo decoding as soon as convergence is achieved. Worst-case channel conditions may require many more iterations than do best-case conditions, and it is desirable to find some way to adjust the number of iterations to no more than required.

Background: Stopping Criteria for Turbo Decoders

Originally, turbo decoders would execute a specific number of iterations regardless of the number of errors inserted by the channel. This was inefficient, since fewer iterations are needed when there are fewer errors in the incoming signal. Efforts have therefore been made to develop adaptive stopping criteria, which would provide an indicator of when the turbo decoding iterations can be stopped.

U.S. Pat. No. 5,761,248 describes adaptive stopping based on cross entropy, or convergence of the output bits: when the decoder's digital output bit estimates (for some block of data) stop changing, the decoding process for that block is halted. However, this stopping criterion requires at least two iterations of the decoding process (in order to generate enough outputs to compare to one another). This can be a waste of processing effort in systems where the channel introduces few errors, or where there is a large amount of data to be decoded. Other stopping criteria, based on the cross entropy criterion, abort decoding based on the ratio of sign changes in the extrinsics to the number of extrinsics.

Another attempt at adaptive stopping was described in Robertson, "Illuminating the Structure of Code and Decoder of Parallel Concatenated Recursive Systematic (Turbo) Codes," 1994 GLOBECOM Proceedings 1298, which generates an estimate of the decoding quality from the second moment of decoded bits.

Turbo Decoder Stopping Based on Mean and Variance of Extrinsics

The present application teaches innovative architectures and methods for aborting the decoding iteration process. Instead of a comparison between successive outputs of the MAP decoders, an absolute indication of the decoded signal quality is compared with a threshold signal quality. The decoders generate soft outputs, or estimates of the original transmitted data symbols. With each decode, these extrinsic values diverge (or their absolute value increases), which indicates greater certainty of the value of the transmitted bit. The values of the extrinsics are used to compute an estimate of the overall signal quality. This estimate of signal quality is constructed from both the mean of output extrinsics and the variance of the extrinsics. When the signal quality reaches the desired performance threshold, iterations are aborted.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
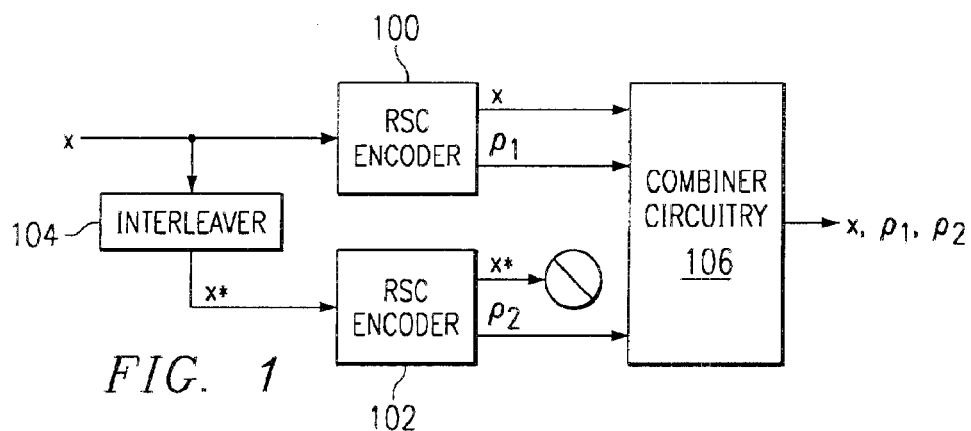
FIG. 1 shows a block diagram for parallel encoders.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Additional Background

Coded digital communication systems use error control codes to improve data reliability. Both the physical propagation medium (the channel) and the hardware used to receive a signal introduce error in the form of noise or signal degradation.

Decoding makes use of redundant bits added to a data stream to detect errors and estimate the most probable value for data bits given the other bits received. The effectiveness of error control codes is expressed in terms of coding gain, which is the difference between the Eb/No needed to achieve a given bit error rate (BER) in a coded system and the Eb/No required to achieve the same BER in an uncoded system.

Though Shannon's noisy channel coding theorem states that arbitrarily low BERs are possible using error control codes, no coding schemes were able to achieve gain near the Shannon limit until 1993 when turbo codes were introduced. Turbo coding provides error control performance to within a few tenths of a decibel of the Shannon limit.

The use of parallel concatenated encoders and iterative decoders distinguishes turbo codes from other coding systems. A PCE consists of two or more recursive systematic encoders (either block or convolutional encoders). Encoders add parity bits to the original message in order to detect the presence of errors in the message. (In a rate ½ convolutional encoder, for instance, two data bits are output for every input data bit.) In the case of two convolutional encoders (a typical case for turbo code schemes) an original message block is encoded using the first encoder, generating a first codeword. The original message is then interleaved (i.e., the input data symbols are reproduced in a different temporal order) and the result is encoded by the second encoder, producing a second codeword. The original message and both codewords are then multiplexed and transmitted to the receiver. The component encoders are typically encoders for block codes or convolutional codes. The symbols are permuted either on a block basis (a block interleaver) or on a sliding window basis (a convolutional interleaver).

Turbo decoders work by passing soft decoding information between two decoding algorithms. Each decoder concentrates on one side of the encoding process, and through successive computations the two decoders arrive at a consensus on the detection of the transmitted data. One decoder executes and generates N new extrinsics (a posterior probabilities for the value of a given information symbol, where N is the number of data symbols), which are then applied to the other decoder. This second decoder executes and generates N new extrinsics, which are passed back to the first decoder. This completes one iteration of the decoding process.

FIG. 1 shows a typical encoder setup. The original data stream, x, is encoded by two recursive systematic convolutional encoders 100, 102. (An encoder is systematic if it sends the uncoded data as part of the coded message, as shown in the rate-½ recursive systematic encoder diagram of FIG. 2.)

In the encoding process, x is encoded by the top encoder 100, and x and $p_1$ (the first codeword) are output. The data x is also interleaved by an interleaver 104 and input to the bottom encoder 102, which generates outputs x* and the second codeword, $p_2$. The original data x, $p_1$, and $p_2$ are combined by combiner circuitry 106 and sent through the channel to the receiver. (Note that the interleaved x* is not sent, since it is redundant information.)

Figure 2:
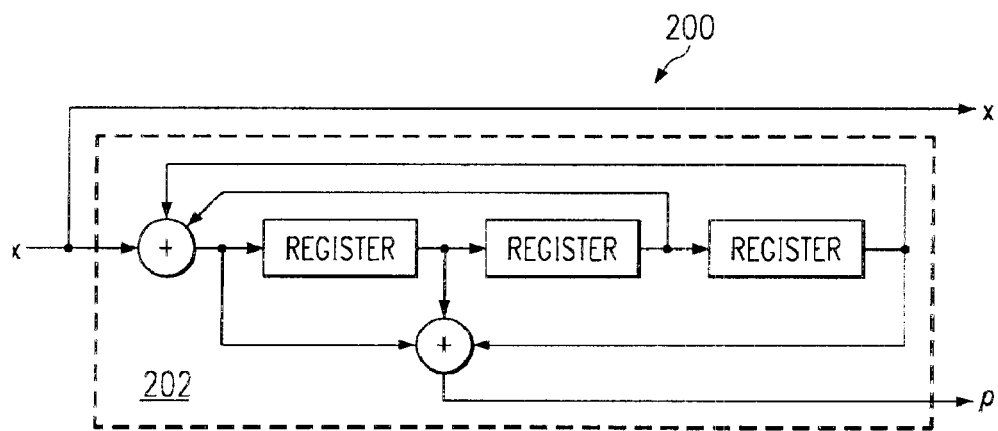
FIG. 2 shows a block diagram for a recursive systematic encoder.

FIG. 2 shows a recursive systematic convolutional encoder 200. The binary data stream x is fed into a shift register circuit 202 consisting of a series of memory elements. With each successive input, the memory elements are added according to a fixed pattern, creating a pair of outputs. One output is the unchanged data x, the other is the coded data p. These outputs can be multiplexed to create a single coded data stream.

Decoders for PCEs would be expensive and computationally inefficient without iterative decoding. Iterative decoding, or turbo decoding, is a relatively low complexity decoding method that exploits the component substructure of the PCE. An iterative decoder has a soft-input/soft-output (SISO) component decoder for each component encoder of the PCE. The decoders generate separate a posterior probabilities for a given information symbol. The decoders take turns decoding the received data, operating on each other's incompletely decoded output. With each iteration, the estimation of the value of an information symbol improves in accuracy.

Figure 3:
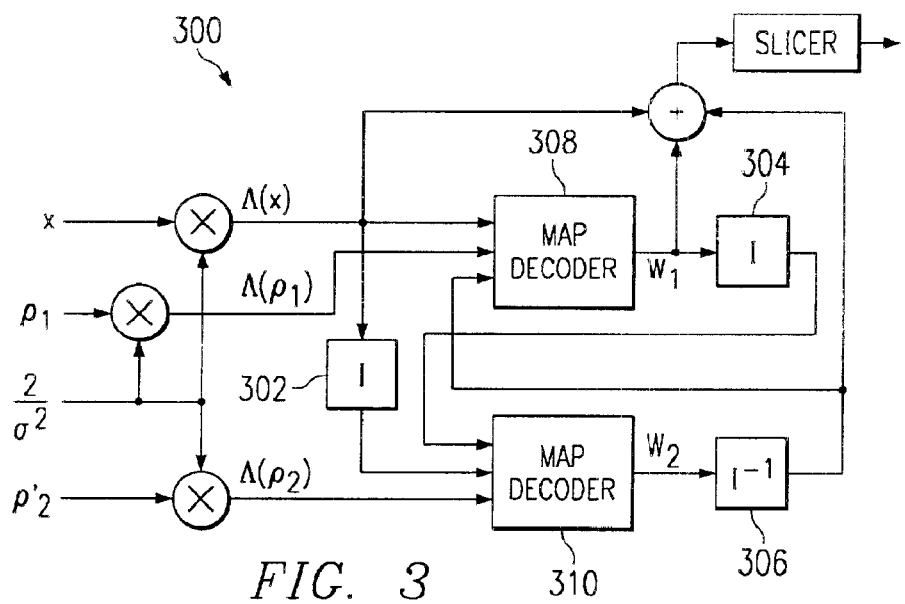
FIG. 3 shows a block diagram of a turbo decoder.

FIG. 3 shows a block diagram of a turbo decoder 300. The original message block x and code words $p_1$ and $p_2$ are scaled by $2/\sigma^2$ (a measure of the channel noise variance) and stored in three separate memories of size N as $^\Lambda(x)$, $^\Lambda(p_1)$, and $^\Lambda(p_2)$ respectively. Interleavers 302, 304 for the data are also of size N. The extrinsic memories have outputs $W_1$ and $W_2$ (the a posterior probability data, or estimates of the probability distribution of a code symbol that are updated with each iteration) which are set to the initial conditions before the first decoding iteration. The scaled inputs $^\Lambda(x)$ and $^\Lambda(p_1)$ and the deinterleaved $W_2$ are applied to the upper MAP decoder 308, as shown in the diagram. This MAP decoder 308 executes and generates N new extrinsics $W_1$ which are stored in the extrinsic memory within the interleaver I 304.

Interleaved $^\Lambda(x)$, $^\Lambda(p_2)$, and interleaved $W_1$ are applied to the lower MAP decoder 310. The lower MAP decoder 310 executes and generates N new extrinsics $W_2$ which are stored in the extrinsic memory of the deinterleaver $I^{-1}$ 306. This completes the first decoding iteration. At each iteration, the upper MAP decoder 308 operates on $^\Lambda(x)$, $^\Lambda(p_1)$, and the deinterleaved $W_2$ (which is updated at each iteration). The lower MAP decoder 310 operates on interleaved $^\Lambda(x)$, $^\Lambda(p_2)$, and the interleaved $W_1$ (which is also updated at each iteration).

Iterations are executed until a specified number have been completed or until the iterations are aborted. When decoding is complete, $^\Lambda(x)$, $W_1$, and deinterleaved $W_2$ are summed. The result is sliced, meaning the same component of each vector $^\Lambda(x)$, $W_1$, and deinterleaved $W_2$ are used to determine that component of the output vector x, which is the decoded message. These decoded bits are then output.

The number of iterations performed varies, typically ranging from three to twenty. Depending on the noise pattern of a given received codeword, the decoder might reach its optimum solution after only one or two iterations. The remaining iterations would not improve performance and are a waste of processing power and time. If the noise pattern of a received codeword is severe, the decoder may require many iterations to reach an optimum solution.

Soft-Decisions

In digital communication systems, data is sent in the form of symbols (usually binary) that take on one value of a finite set of possible values. These symbols are modulated onto a carrier signal that is transmitted through the channel to a receiver. In the receiver, detection circuitry examines the received signal and determines what symbols were most likely transmitted. For example, in a binary hard-decision system, the receiver determines if a zero or a one was sent, and outputs a zero or one accordingly. No information as to the quality of the symbol determination is included in a hard-decision output.

Soft-decision decoding takes advantage of additional information generated by the receiver decision circuitry. Rather than assign a zero or a one to each received binary signal, soft-decision receivers use an expanded set of symbols to describe the value of a given transmitted piece of data. For example, in one implementation, each binary data symbol transmitted in the original data stream is expressed as an eight-bit value. Different regions are established that indicate the strength of the decision, with intermediate values given to decisions that are less reliable.

In the preferred embodiment, the output of the encoder is binary (zeros and ones). A modulator maps the ones to a positive one value and maps the zeros to a negative one value. When the receiver determines a particular received symbol, it expresses it as an eight-bit value, the "soft" decision. The closer a soft-decision gets to its extreme value, the more reliable the estimation of the original data bit. These estimates are made after each MAP decode, which is a substep of a full iteration. In the preferred embodiment, one iteration consists of two MAP decodes. (Note that the number of MAP decoders required depends on the number of encoders used.)

As a turbo decoder goes through its iterations, the certainty of the value of a given information symbol generally increases. Thus, with each iteration substep (i.e., each MAP decode), the value of a "zero" in the original data stream will become more and more negative (since the zeros are modulated into negative numbers) and the value of a "one" in the original data stream will become more and more positive (because the ones were modulated as positive numbers).

Stopping Criteria for Turbo Decoders

All the functions of the stopping criterion can be easily implemented in hardware except for division, which cannot be implemented in an efficient manner. Typically, division functions like A/B are implemented as A×1/B. 1/B is implemented as a lookup table. This solution works satisfactorily as long as the range of numbers for B is small. In a previous method of turbo decoding, the stopping criterion required division by a variable quantity N. N (the number of extrinsics generated by the component decoders) can be large, ranging from 320 to 5120. Often, division by N must be performed from $10^2$ to $10^6$ times. It is therefore inefficient to implement this one division.

Turbo Decoder Stopping Criterion Improvement

The present application discloses an innovative improvement to the turbo decoding stopping criterion. The improved stopping criterion requires no division functions. By manipulating the algorithm, division by message dependent quantity N is eliminated and replaced with multiplication by a constant. This greatly simplifies the execution of the algorithm and makes hardware implementation much more efficient.

Figure 4:
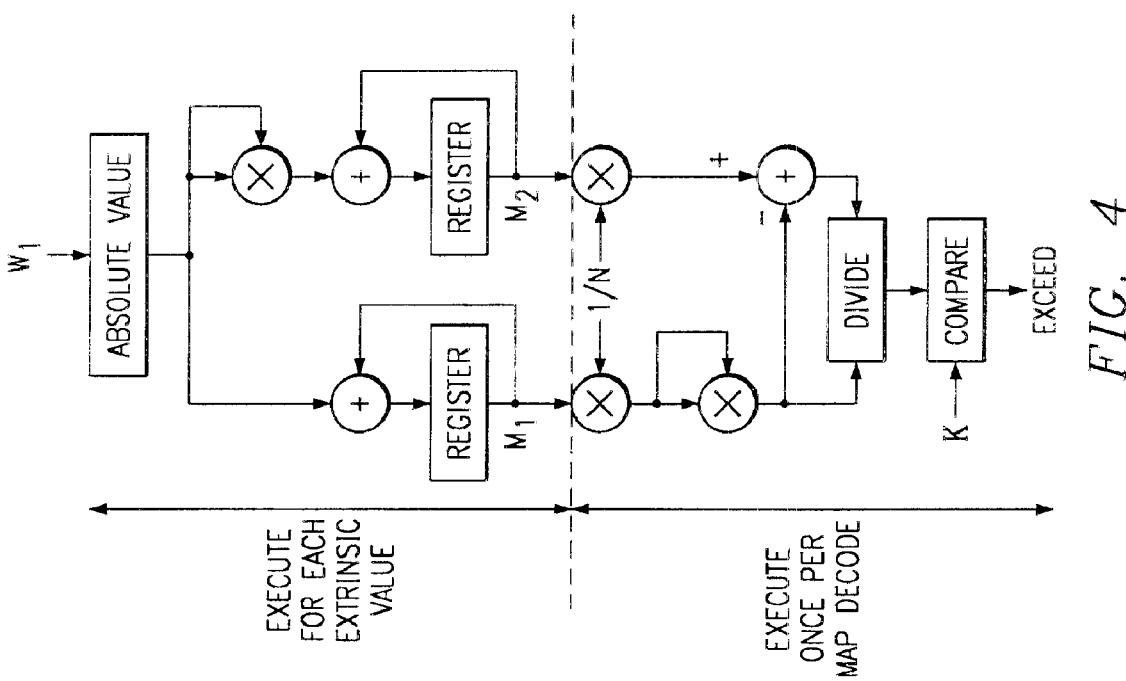
FIG. 4 shows a stopping criterion implementation using division by a variable quantity N.

FIG. 4 shows a block diagram of a stopping criterion implementation. The block diagram is broken into two regions. The top half generates the two moments $M_1$ and $M_2$, which are needed to compute the SNR for the extrinsics. $M_1$ is the sum of the N extrinsics at any given point in the iterative decoding process, and $M_2$ is the sum of the squares of the N extrinsics at a given point. Their equations are $$M_1 = \Sigma |W_i|$$

and $$M_2 = \Sigma |W_i|^2$$

where i is summed from 1 to N. The top section is executed once for each of the N extrinsics, generating a single $M_1$ and a single $M_2$. Each component of the extrinsic $W_i$ is input and added to the sum, which is stored in the register.

$M_1$ and $M_2$ serve as input for the bottom half of the stopping criterion. These quantities are used to compute a signal-to-noise ratio estimate from the extrinsics. The extrinsics $W_i$ are assumed to be distributed as a bimodal Gaussian probability distribution function, with one mean at +m and another mean at −m. Each mode has the same conditional variance $v^2$. The absolute value of the probability distribution function is taken, making a single mean at +m. An increase in this mean indicates greater certainty in the value of the decoded bits. An increase in the variance would indicate less certainty in the decoded values.

Alternatively, the divergence of the decoded bits can be used. If the absolute value is not taken of the probability distribution function, the two means (the positive and negative modes) will diverge as decoding progresses.

An estimate of signal quality based on the mean and variance of the extrinsics is computed by dividing the $m^2$ (the signal) by $v^2$ (the noise). The mean m is estimated by $$m = \frac{\sum |W_i|}{N}$$

and the optimal estimate for the variance is $$v^2 = \frac{\sum |W_i|^2}{N} - \left(\frac{\sum |W_i|}{N}\right)^2$$

The bottom half of the block diagram in FIG. 4 generates the signal quality estimate, which is then compared with the threshold K. If the quality estimate is greater than the threshold, then the Exceed signal is active. The Exceed signal will inform the turbo decoder to stop executing its remaining iterations because an optimum solution has been reached. The bottom half executes only once per MAP decode.

Figure 5A:
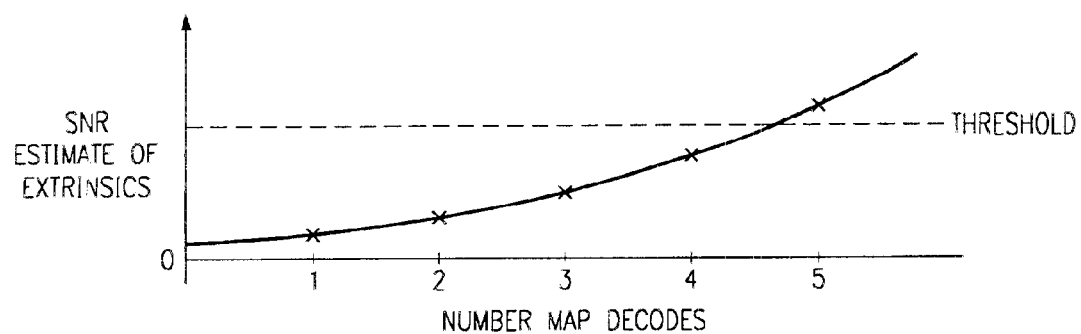
FIGS. 5a and 5b show graphs of SNR calculated from soft-decision output values as MAP decodes are executed.
Figure 5B:
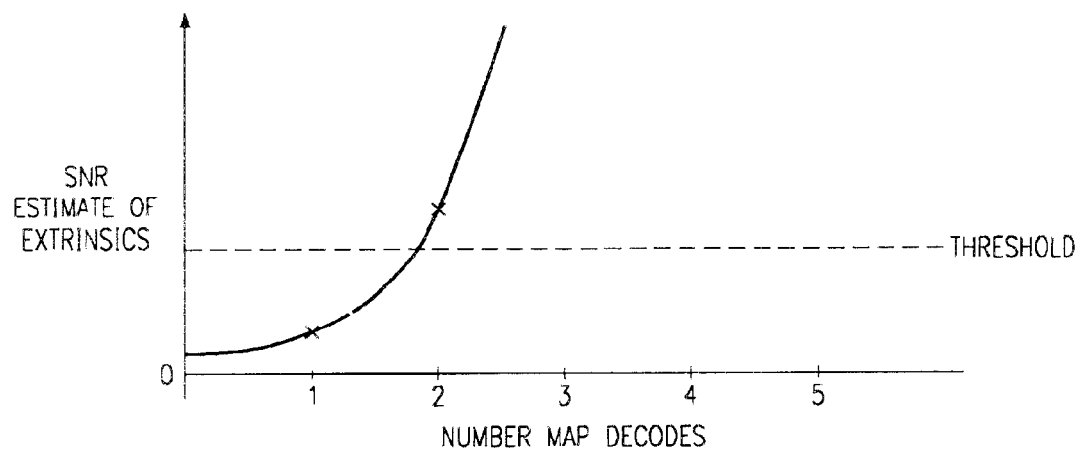

FIGS. 5a and 5b show a graphical representation of the change in extrinsic values as MAP decodes are executed. The "x" symbols represent SNR values calculated for the extrinsics after each MAP decode. In FIG. 5a, 5 MAP decodes are executed before the SNR of the extrinsics exceeds the threshold. After the $5^{th}$ decode, no more iterations are executed. Note that this represents only 2.5 full turbo decode iterations, since two MAP decodes complete one iteration in the preferred embodiment.

FIG. 5b shows an example decode for a system with fewer errors than shown in FIG. 5a. When fewer errors are inserted in the data stream, fewer MAP decodes are necessary to reach an acceptable SNR. Thus, as shown in FIG. 5b, only two MAP decodes produces a SNR above the threshold. Decoding would stop at this point.

The following algebraic expression for the bottom half of the diagram shows the comparison of the SNR (computed from the extrinsics) with K, the threshold SNR.

$$\frac{\left(\frac{\sum |W_i|}{N}\right)^2}{\frac{\sum |W_i|^2}{N} - \left(\frac{\sum |W_i|}{N}\right)^2} > K$$

The top half of the block diagram requires 2N additions, N multiplications, and N absolute value functions. The bottom half requires 3 divisions, 1 multiplication, 1 subtraction, and 1 comparison.

Figure 6:
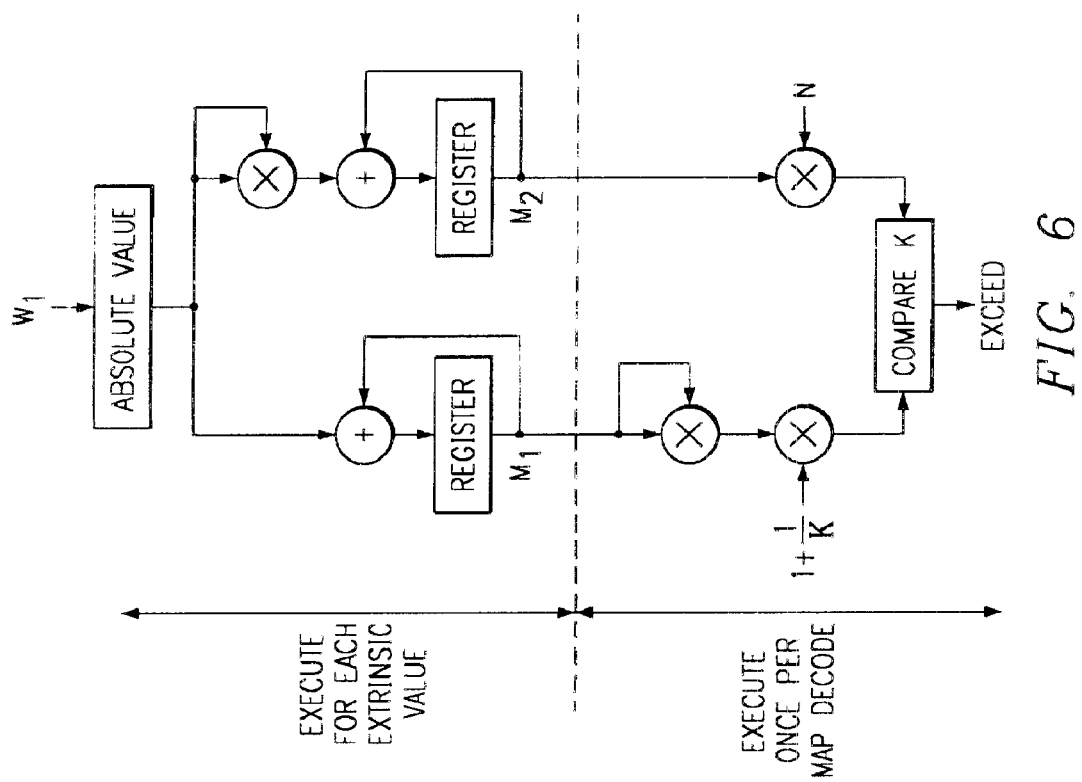
FIG. 6 shows a stopping criterion implementation without division by N.

FIG. 6 shows the innovative stopping criterion in a block diagram. The comparison equation for the bottom half of the algorithm is rewritten by multiplying the denominator and numerator by $N^2$. The equation can be rewritten as follows.

$$\frac{(\sum |W_i|)^2}{N \sum |W_i|^2 - (\sum |W_i|)^2} > k$$

$$\left(1 + \frac{1}{K}\right) \times (\sum |W_i|)^2 > N \sum |W_i|^2$$

This equation is the basis for the block diagram shown in FIG. 6. The bottom half division functions are replaced by two multiplications. One multiplier can be used and multiplexed three times for an efficient implementation. The K threshold has now been replaced with a 1+1/K threshold. Since K is a constant, 1+1/K is also a constant which can be precomputed by the user or generated from a simple lookup table prior to the start of a turbo decode.

The top half of the algorithm is the same as the stopping criterion in FIG. 4. The bottom half of the diagram shows that N is no longer a denominator, which greatly simplifies hardware implementation. $M_1$ is squared and multiplied by 1+1/K. This value is compared to the product of $M_2$ and N.

The value of the threshold is still a constant, and when the computed quality estimate of the decoded signal exceeds the threshold, the decoding iterations are stopped. This allows the decoding to continue when there are large numbers of errors introduced into the signal by the channel while it prevents the decoder from executing useless iterations when few errors are introduced.

Definitions:

Following are short definitions of the usual meanings of some of the technical terms which are used in the present application. (However, those of ordinary skill will recognize whether the context requires a different meaning.) Additional definitions can be found in the standard technical dictionaries and Journals.

Eb/No: Ratio of energy per modulating bit to the noise spectral density.

BER: Bit error rate.

PCE: Parallel Concatenated Encoder.

SI/SO: Soft-input soft-output. "Soft" input or output refers to using greater bit size (for instance, 8-bits) to describe a given data symbol.

MAP decoder: Maximum A-Posterior. MAP decoders use a detection criterion that leads to the selection of x that maximizes the probability p(x/r) of a symbol x given some received information r.

Extrinsic: Outputs of decoders that estimate the values of decoded bits. Extrinsics are usually soft estimates.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

In particular, the disclosed inventions are not necessarily limited to "turbo decoding" as implemented in 1999. This is a very active area of technological development, and many improvements and modifications are undoubtedly in existence or soon to come. Even if future improved decoding architectures with iterative processing of soft estimates are referred to by names other than "turbo decoding", the disclosed inventions may still be applicable.

For instance, multi-bit symbols could be used in lieu of binary symbols as the original data stream. Alternatively, future versions of iterative decoding might apply to analog signals rather than digital signals. The claimed inventions can also be applied to decoder architectures that implement these changes.

Other decoding methods, such as pipeline decoding, or turbo codes that use more encoders than described in the present application may also be within the contemplation of the present innovations.

Further details and descriptions of the present state of the art may be found in TURBO CODING, by Heegard and Wicker, and ERROR CONTROL SYSTEMS, by Wicker, which are hereby incorporated by reference.

What is claimed is:

1. A turbo decoding system, comprising:
   a decoder module, using an adaptive abort criterion; and
   means to provide said adaptive abort criterion based on the mean and the variance of partially decoded extrinsics, wherein decoding is aborted based on a comparison result.

2. The system of claim 1, wherein the abort criterion is generated as a ratio of the mean and the variance of the extrinsics.

3. An iterative decoder system for a recursive systematic encoder, comprising:

a decoder module, for providing estimates of data symbols generated through an iterative decoding process;

circuitry including a comparison algorithm for comparing a derived quality attribute of the generated data symbol estimates to a predetermined threshold; said derived quality attribute based on the mean and the variance of partially decoded extrinsics; and circuitry for aborting decoding on a comparison result.

4. The system of claim 3, wherein the derived quality attribute is generated as a ratio of the mean and the variance of the estimates.

5. A method for determining an abort criterion in turbo decoding, comprising the steps of:

generating extrinsic values;

for each extrinsic value, generating a signal-to-noise ratio from the mean and the variance of the extrinsic values;

comparing the generated signal-to-noise ratio to a threshold signal-to-noise ratio; and aborting the turbo decoding based on a comparison result.

6. The method of claim 5, wherein the signal-to-noise ratio is computed by dividing the mean of the extrinsic values by the variance of the extrinsic values.

7. A method for determining an abort criterion in iterative decoding, comprising the steps of:

generating extrinsic values;

generating a quality attribute based on the mean and variance of the extrinsic values;

comparing the quality attribute to a predetermined threshold; and aborting the turbo decoding based on a comparison result.

8. The method of claim 7, wherein the quality attribute is generated as a ratio of the mean and the variance of the extrinsic values.

9. A method for determining an abort criterion in iterative decoding, comprising the steps of:

generating extrinsic values after an iteration substep;

measuring the mean of the extrinsic values;

measuring the variance of the extrinsic values;

generating a quality attribute based on the mean and the variance;

comparing the quality attribute to a predetermined threshold; and aborting the turbo decoding based on a comparison result.

10. The method of claim 9, wherein the quality attribute is generated as a ratio of the mean and the variance of the extrinsic values.

* * * * *